US007275925B2

(12) United States Patent
Farnworth (10) Patent No.: US 7,275,925 B2
(45) Date of Patent: Oct. 2, 2007

(54) APPARATUS FOR STEREOLITHOGRAPHIC PROCESSING OF COMPONENTS AND ASSEMBLIES

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/944,488

(22) Filed: Aug. 30, 2001

(65) Prior Publication Data

US 2003/0043360 A1    Mar. 6, 2003

(51) Int. Cl.
*B29C 35/08*    (2006.01)

(52) U.S. Cl. .................. 425/174.4; 425/121; 425/122; 430/322; 700/120

(58) Field of Classification Search ............. 425/174.4, 425/121, 123, 125; 700/120; 430/322, 323
See application file for complete search history.

(56) References Cited

U.S. PATENT DOCUMENTS

| | | | |
|---|---|---|---|
| 5,173,220 A | 12/1992 | Reiff et al. | |
| 5,196,371 A | 3/1993 | Kulesza et al. | 438/119 |
| 5,264,061 A | 11/1993 | Juskey et al. | |
| 5,286,426 A * | 2/1994 | Rano et al. | 264/40.1 |
| 5,484,314 A | 1/1996 | Farnworth | |
| 5,609,889 A * | 3/1997 | Weber | 425/116 |
| 5,705,117 A | 1/1998 | O'Connor et al. | |
| 5,985,185 A * | 11/1999 | Steijer et al. | 264/1.7 |
| 6,193,493 B1 * | 2/2001 | Steijer et al. | 425/116 |
| 6,251,488 B1 | 6/2001 | Miller et al. | 427/596 |
| 6,259,962 B1 | 7/2001 | Gothait | 700/119 |
| 6,268,584 B1 | 7/2001 | Keicher et al. | 219/121.64 |
| 6,280,661 B1 * | 8/2001 | Takakuwa et al. | 264/1.33 |
| 6,326,698 B1 | 12/2001 | Akram | 257/781 |
| 6,337,122 B1 | 1/2002 | Grigg et al. | 428/195.1 |
| 6,391,251 B1 | 5/2002 | Keicher et al. | 419/7 |
| 6,432,752 B1 | 8/2002 | Farnworth | 438/127 |
| 6,468,891 B2 | 10/2002 | Williams | 438/597 |
| 6,482,576 B1 * | 11/2002 | Farnworth et al. | 430/322 |
| 6,489,007 B2 | 12/2002 | Grigg et al. | 428/132 |
| 6,500,746 B2 | 12/2002 | Williams | 438/597 |
| 6,506,671 B1 | 1/2003 | Grigg | 438/612 |

(Continued)

OTHER PUBLICATIONS

Miller et al., "Maskless Mesoscale Materials Deposition", Deposition Technology, Sep. 2001, pp. 20-22.

(Continued)

*Primary Examiner*—Yogendra N. Gupta
*Assistant Examiner*—Emmanuel S. Luk
(74) *Attorney, Agent, or Firm*—TraskBritt (57) ABSTRACT

An apparatus for providing gross location, planarization, and mechanical restraint to one or more electronic components such as semiconductor dice to be subjected to stereolithographic processing. A double platen assembly including a first platen and a second platen mutually removably connected and configured and arranged to substantially secure an electronic component assembly in position therebetween. At least one of the platens is configured such that a portion of electronic components of a carrier substrate secured by the double platen assembly is viewable for exposure to an energy beam such as a laser beam used to cure a liquid into an associated dielectric stereolithographic packaging structure. Another embodiment includes the use of an adhesive-coated film for holding, locating and securing a plurality of individual electronic components for processing. A method of forming solder balls is also disclosed.

45 Claims, 5 Drawing Sheets

U.S. PATENT DOCUMENTS

| | | | |
|---|---|---|---|
| 6,514,798 B2 | 2/2003 | Farnworth | 438/127 |
| 6,524,346 B1 | 2/2003 | Farnworth | 438/763 |
| 6,525,408 B2 | 2/2003 | Akram et al. | 257/668 |
| 6,537,842 B2 | 3/2003 | Akram | 438/48 |
| 6,544,465 B1 | 4/2003 | Farnworth et al. | 264/401 |
| 6,544,821 B2 | 4/2003 | Akram | 438/127 |
| 6,544,902 B1 | 4/2003 | Farnworth | 438/781 |
| 6,548,897 B2 | 4/2003 | Grigg | 257/737 |
| 6,549,821 B1 | 4/2003 | Farnworth et al. | |
| 6,562,272 B1 * | 5/2003 | Chang et al. | 264/272.14 |
| 6,562,278 B1 | 5/2003 | Farnworth et al. | 264/401 |
| 6,569,753 B1 | 5/2003 | Akram et al. | 438/612 |
| 6,585,927 B2 | 7/2003 | Grigg et al. | 264/401 |
| 6,593,171 B2 | 7/2003 | Farnworth | 438/127 |
| 6,593,220 B1 | 7/2003 | Yu et al. | 438/612 |
| 6,607,689 B1 | 8/2003 | Farnworth | 264/401 |
| 6,635,333 B2 | 10/2003 | Grigg et al. | 428/134 |
| 6,668,449 B2 | 12/2003 | Rumsey et al. | 29/840 |
| 2002/0066966 A1 | 6/2002 | Farnworth | |
| 2002/0098623 A1 | 7/2002 | Akram | |
| 2002/0105074 A1 | 8/2002 | Akram et al. | |
| 2002/0171177 A1 | 11/2002 | Kritchman et al. | |
| 2002/0182782 A1 | 12/2002 | Farnworth | |
| 2002/0195748 A1 | 12/2002 | Farnworth | |
| 2003/0003179 A1 | 1/2003 | Farnworth et al. | |
| 2003/0003180 A1 | 1/2003 | Farnworth et al. | |
| 2003/0003380 A1 | 1/2003 | Farnworth et al. | |
| 2003/0003405 A1 | 1/2003 | Farnworth et al. | |
| 2003/0068584 A1 | 4/2003 | Farnworth et al. | |
| 2003/0072926 A1 | 4/2003 | Grigg et al. | |
| 2003/0077418 A1 | 4/2003 | Grigg et al. | |
| 2003/0089999 A1 | 5/2003 | Akram | |
| 2003/0092220 A1 | 5/2003 | Akram | |
| 2003/0093173 A1 | 5/2003 | Farnworth et al. | |
| 2003/0098499 A1 | 5/2003 | Akram et al. | |
| 2003/0102566 A1 | 6/2003 | Farnworth | |
| 2003/0129787 A1 | 7/2003 | Farnworth | |
| 2003/0139030 A1 | 7/2003 | Grigg | |
| 2003/0151167 A1 | 8/2003 | Kritchman et al. | |
| 2003/0155693 A1 | 8/2003 | Farnworth et al. | |
| 2003/0173665 A1 | 9/2003 | Grigg | |
| 2003/0176016 A1 | 9/2003 | Grigg | |
| 2003/0193092 A1 | 10/2003 | Tan et al. | |
| 2003/0201531 A1 | 10/2003 | Farnworth et al. | |
| 2003/0203158 A1 | 10/2003 | Farnworth et al. | |
| 2003/0203612 A1 | 10/2003 | Akram et al. | |
| 2003/0205849 A1 | 11/2003 | Farnworth | |

OTHER PUBLICATIONS

Miller, "New Laser-Directed Deposition Technology", Microelectronic Fabrication, Aug. 2001, p. 16.

Webpage, Objet Prototyping the Future, "Objet FullCure700 Series", 1 page.

Webpage, Objet Protyping the Future, "How it Works", 2 pages.

U.S. Appl. No. 09/589,841, filed Jun. 8, 2000, entitled "Stereolithographic Methods for Forming a Protective Layer on a Semiconductor Device Substrate and Substrates Including Protective Layers So Formed", inventor Farnworth et al.

U.S. Appl. No. 09/590,646, filed Jun. 8, 2000, entitled "Reinforced, Self-Aligning Conductive Structures for Semiconductor Device Components and Methods for Fabricating Same", inventor Williams et al.

U.S. Appl. No. 09/651,930, filed Aug. 31, 2000, entitled "Semiconductor Device Including Leads in Communication with Contact Pads Thereof and a Stereolithographically Fabricated Package Substantially Encapsulating the Leads and Methods for Fabricating the Same", inventor Salman Akram.

U.S. Appl. No. 10/191,424, filed Jul. 8, 2002, entitled "Semiconductor Devices with Permanent Polymer Stencil and Method for Manufacturing the Same", inventor Farnworth et al.

U.S. Appl. No. 10/201,208, filed Jul. 22, 2002, entitled "Thick Solder Mask for Confining Encapsulant Material Over Selected Locations of a Substrate, Assemblies Including the Solder Mask, and Methods", inventor Grigg et al.

U.S. Appl. No. 10/370,755, filed Feb. 20, 2003, entitled "Chip Scale Package Structures and Method of Forming Conductive Bumps Thereon", inventor Warren M. Farnworth.

U.S. Appl. No. 10/608,749, filed Jun. 26, 2003, entitled "Methods for Labeling Semiconductor Device Components", inventor Grigg et al.

U.S. Appl. No. 10/619,918, filed Jul. 15, 2003, entitled "Stereolithographic Methods for Fabricating Hermetic Semiconductor Device Packages and Semiconductor Devices Including Stereolithographically Fabricated Hermetic Packages", inventor Warren M. Farnworth.

U.S. Appl. No. 10/642,908, filed Aug. 18, 2003, entitled "Solder Masks for Use on Carrier Substrates, Carrier Substrates and Semiconductor Device Assemblies Including Such Solder Masks, and Methods", inventor Tan et al.

U.S. Appl. No. 10/663,402, filed Sep. 16, 2003, entitled "Processes for Facilitating Removal of Stereolithographically Fabricated Objects from Platens of Stereolithographic Fabrication Equipment, Object Release Elements for Effecting Such Processes, Systems and Fabrication Processes Employing the Object Release Elements, and Objects Which Have Been Fabricated Using the Object Release Elements", inventor Farnworth et al.

U.S. Appl. No. 10/688,354, filed Oct. 17, 2003, entitled "Thick Solder Mask for Confining Encapsulant Material Over Selected Locations of a Substrate and Assemblies Including the Solder Mask", inventor Grigg et al.

U.S. Appl. No. 10/690,417, filed Oct. 20, 2003, entitled "Methods of Coating and Singulating Wafers and Chip-Scale Packages Formed Therefrom", inventor Farnworth et al.

* cited by examiner

APPARATUS FOR STEREOLITHOGRAPHIC PROCESSING OF COMPONENTS AND ASSEMBLIES

BACKGROUND OF THE INVENTION

1. Field of the Invention

The present invention relates generally to stereolithography and, more specifically, to a platen apparatus and method of using the platen apparatus to provide gross location, planarization, and mechanical restraint to electronic components and assemblies before, during, and after stereolithography processes.

2. State of the Art

In the past decade, a three-dimensional manufacturing technique termed "stereolithography," also known as "layered manufacturing," has evolved to a degree where it is employed in many industries.

Essentially, stereolithography, as conventionally practiced, involves utilizing a computer to generate a three-dimensional (3-D) mathematical simulation or model of an object to be fabricated, such generation usually effected with 3-D computer-aided design (CAD) software. The model or simulation is mathematically separated or "sliced" into a large number of relatively thin, parallel, usually vertically superimposed layers, each layer having defined boundaries and other features associated with the model (and thus the actual object to be fabricated) at the level of that layer within the exterior boundaries of the object. A complete assembly or stack of all of the layers defines the entire object, and surface resolution of the object is, in part, dependent upon the thickness of the layers.

The mathematical simulation or model is then employed to generate an actual object by building the object, layer by superimposed layer. A wide variety of approaches to stereolithography by different companies has resulted in techniques for fabrication of objects from both metallic and nonmetallic materials. Regardless of the material employed to fabricate an object, stereolithographic techniques usually involve disposition of a layer of unconsolidated or unfixed material corresponding to each layer within the object boundaries, followed by selective consolidation or fixation of the material to at least a semisolid state in those areas of a given layer corresponding to portions of the object, the consolidated or fixed material also at that time being substantially concurrently bonded to a lower layer. The unconsolidated material employed to build an object may be supplied in particulate or liquid form, and the material itself may be consolidated, fixed or cured, or a separate binder material may be employed to bond material particles to one another and to those of a previously formed layer. In some instances, thin sheets of material may be superimposed to build an object, each sheet being fixed to a next lower sheet and unwanted portions of each sheet removed, a stack of such sheets defining the completed object. When particulate materials are employed, resolution of object surfaces is highly dependent upon particle size, whereas when a liquid is employed, resolution is highly dependent upon the minimum surface area of the liquid which can be fixed (cured) and the minimum thickness of a layer which can be generated given the viscosity of the liquid and other parameters such as transparency to radiation or particle bombardment used to effect at least a partial cure of the liquid to a structurally stable state. Of course, in either case, resolution and accuracy of object reproduction from the CAD file is also dependent upon the ability of the apparatus used to fix the material to precisely track the mathematical instructions indicating solid areas and boundaries for each layer of material. Toward that end, and depending upon the layer being fixed, various fixation approaches have been employed, including particle bombardment (electron beams), disposing a binder or other fixative (such as by ink-jet printing techniques), or irradiation using heat or specific wavelength ranges.

An early application of stereolithography was to enable rapid fabrication of molds and prototypes of objects from CAD files. Thus, either male or female forms on which mold material might be disposed might be rapidly generated. Prototypes of objects might be built to verify the accuracy of the CAD file defining the object and to detect any design deficiencies and possible fabrication problems before a design is committed to large-scale production.

Stereolithography has also been employed to develop and refine object designs in relatively inexpensive materials and has also been used to fabricate small quantities of objects where the cost of conventional fabrication techniques is prohibitive for same, such as in the case of plastic objects conventionally formed by injection molding. It is also known to employ stereolithography in the custom fabrication of products generally built in small quantities or where a product design is rendered only once. Finally, it has been appreciated in some industries that stereolithography provides a capability to fabricate products, such as those including closed interior chambers or convoluted passageways, which cannot be fabricated satisfactorily using conventional manufacturing techniques.

More recently, stereolithography has been used to apply material to preformed electronic components and resulting structures with a high degree of precision. For example, stereolithographic techniques may be used to apply protective or alignment structures to substrates. A substrate used for effecting electrical testing of semiconductor devices or to connect same to each other or to higher level packaging may be provided with a protective structure in the form of a layer of dielectric material having a controlled thickness or depth and defining precisely sized, shaped and located apertures through which conductive terminals on the surface of the substrate may be accessed for testing of a semiconductor die disposed on the substrate.

The dielectric layer, in addition to physically protecting, sealing and isolating circuit traces on the substrate from contact with connective elements on the superimposed semiconductor die to prevent shorting, may be employed as desired as a structure to mechanically align the semiconductor die with the substrate for proper communication of the connective elements with the substrate terminals. This may be effected in the context of a so-called "flip-chip" semiconductor die bearing a pattern of discrete connective elements projecting transversely from the active surface of the die (such as solder bumps or conductive or conductor-bearing polymers), by using precisely sized and located apertures in the dielectric material to partially receive the connective elements. In addition to, or in lieu of, such an alignment structure approach, upwardly projecting alignment elements comprising the same material as that of the dielectric layer may be fabricated on the dielectric layer. Such alignment elements may, for example, comprise C-shaped projections located on opposing sides of an intended location for the semiconductor die, L-shaped projections at corners of the intended die location, or linear segments parallel to, and defining a slightly larger area than, the side of a rectangular die.

Such protective or alignment elements may be applied to a dielectric layer or layer segments using stereolithographic techniques. Formation of the protective or alignment structures is accomplished by suspending a substrate on a support platform within a reservoir containing a curable liquid as commonly used in stereolithography (typically a photopolymer). The platform is vertically moveable such that a substrate suspended thereon may be moved in precise increments into or out of the curable liquid. Layer thickness and shape for the desired stereolithographic formations are typically programmed into a computer control system which monitors the stereolithographic process. In response to the control system, the platform upon which a substrate is suspended is lowered into the reservoir to a desired depth within the liquid such that a layer of curable liquid in the reservoir covers or lies adjacent a certain level with respect to the suspended substrate. Precisely focused electromagnetic radiation in the form of an ultraviolet (UV) wavelength laser is triggered to fix or cure at least a portion of the liquid material on or adjacent the substrate. The platform is then lowered by a distance equal to the thickness of the next desired layer to provide a new layer of curable liquid and the laser is again triggered to cure at least a portion of the liquid. The process is then repeated layer by layer until the desired stereolithographic structure is formed on and about the substrate. The platform is then raised above the level of the liquid and the substrate with associated stereolithographic structure is removed.

It is also known to fabricate packaging for semiconductor dice using stereolithographic techniques. A semiconductor die is placed on a platform of a stereolithography apparatus or on stereolithographically formed supports on the platform. As discussed above, the platform is lowered into the reservoir to a desired liquid depth such that a layer of the curable liquid covers or lies adjacent a certain level with respect to the suspended semiconductor die. Precisely focused electromagnetic radiation in the form of an ultraviolet (UV) wavelength laser is triggered to fix or cure at least a portion of the liquid material in a desired pattern on or adjacent the semiconductor die. The platform is then lowered by a distance equal to the thickness of the next desired layer to provide a new layer of curable liquid and the laser is again triggered to cure at least a portion of the liquid in a desired pattern. The process is then repeated layer by layer until the desired stereolithographic structure is formed on and about the semiconductor die. The process may be used to define a dielectric layer about bond pad or conductive bump locations, over wire bonds, over portions of leads, or as otherwise desired. The platform is then raised above the level of the liquid and the semiconductor die with associated stereolithographic structure is removed.

By their diminutive nature in terms of gross dimensions and the minute features and elements thereof, semiconductor dice and other components such as test interposers, leads and other connective elements, interposers for converting dice to a flip-chip configuration and other, similar structures (hereinafter generally and collectively termed "electronic components") are very fragile and susceptible to damage in addition to lacking structural rigidity, including torsional rigidity. This is particularly true of bare (unpackaged) semiconductor dice. Thus, exposure of semiconductor dice and other minute components to the processing and handling steps involved in stereolithographic methods can result in damage to or destruction of the components.

In addition, while it may be possible to form stereolithographic structures on one or more electronic components secured to, for example, circuit boards, interposers and lead frame strips (hereinafter generally and collectively referred to as "carrier substrates"), such combinations of electronic components and carrier substrates being termed "electronic component assemblies" herein, location of such component-bearing elements is perceived to present a problem. In addition, any lack of planarity of such carrier substrates, which may be accentuated by warping and twisting during processing as well as handling between process steps, may compromise planarity of an electronic component about or on which stereolithographic structures are formed, resulting (by way of example only) in uneven coverage of one or more surfaces, elements or features of a semiconductor die being packaged or, in the instance of an alignment or support structure being formed, unsatisfactory dimensional tolerances which may lead to misalignment with respect to another component such as a die, interposer or other substrate to be subsequently associated with the alignment or support structure being fabricated.

Further, damage may occur to the electronic components or the electronic component assemblies during the transferring of the electronic component to the platform of the stereolithography apparatus, during removal of the electronic component from the platform, and during the stereolithographic process itself.

Moreover, the inventor herein has recognized that fabricating stereolithographic structures in association with a large plurality of electronic components or electronic component assemblies, such as would be required to implement at least partially automated stereolithographic techniques in the electronics industry on a commercial basis, will require assurance of at least gross positioning and planarity of all electronic components and/or assemblies carrying such electronic components on a given stereolithography platform and, desirably, a technique to mechanically restrain such components to their locations during different processing and handling steps before, during and after stereolithography. The aforementioned reasons as to the need for planarity should be readily apparent from the description above but, as to the need for gross positioning, a further explanation may be in order.

It has been disclosed and claimed in U.S. patent application Ser. No. 09/259,142, assigned to the assignee of the present invention and issued as U.S. Pat. No. 6,549,821, to modify a conventional stereolithography apparatus such as those offered by 3D Systems, Inc. with a machine vision system to precisely locate features on electronic components so as to enable fabrication of stereolithographic structures thereon. While a machine vision system enables fabrication of such structures on a large plurality of electronic components residing on a platform of a stereolithography apparatus and while a machine vision system may be employed to plot the gross (general) location and orientation of electronic components on a platform, such an approach may undesirably consume computer processing power as well as require a machine vision system employing two camera systems, one for determining the gross locations and orientations of the electronic components and another one for focusing on the surfaces, elements and features of an individual electronic component for precise placement of stereolithographic structures thereon. In addition, such an approach still requires handling of individual electronic components or electronic component assemblies to place same on the platform for fabrication of the stereolithographic structures and remove same after fabrication thereof for further processing. This necessity both enhances the potential for damage and contamination and inhibits automation of the stereolithography process for the described applications.

Thus, it would be desirable to provide an apparatus and method for gross location and orientation of, restraint of and assuring planarity of pluralities of electronic components and electronic component assemblies undergoing stereolithography processes and to facilitate handling of the pluralities of electronic components and electronic component assemblies.

BRIEF SUMMARY OF THE INVENTION

The present invention provides a method and apparatus for locating, orienting, manipulating and protecting pluralities of electronic components and electronic component assemblies before, during and after fabrication of stereolithographic structures thereon.

One embodiment of the present invention comprises a double platen assembly for carrying a plurality of electronic component assemblies. The double platen assembly includes a lower platen having a plurality of alignment elements for engaging alignment features of a plurality of carrier substrates, each having secured thereto at least one electronic component, and an upper platen configured for cooperative engagement with the lower platen to secure the plurality of carrier substrates in place. The carrier substrates may thus be located and oriented within a field of vision of a machine vision system camera configured for detection of the minute surfaces, elements and features of the individual electronic components of the electronic component assemblies. As desired, the lower platen of the double platen assembly may be configured with platen assembly alignment features for engaging platen assembly alignment elements of a stereolithography apparatus platform or other like structure so that the double platen assembly is securable to the platform such that the locations and orientations of the electronic components on the carrier substrates are known within relatively close tolerances. Thus, the central processing unit controlling the stereolithography apparatus may be preprogrammed with the gross locations and orientations of the electronic component or components carried on the carrier substrates as held by the double platen assembly and the machine vision system directed under such programming to place its limited but highly magnified field of vision over each electronic component site, recognize the surfaces, elements and features of relevance thereon as stored in computer memory for fabrication of a stereolithographic structure on and/or about the electronic component secured at each such site and direct an energy beam such as a laser beam in an appropriate pattern to selectively cure the curable liquid used in the stereolithography process to at least a semisolid state. It is notable that the double platen assembly ensures substantial planarity of the carrier substrates and, thus, of the electronic components secured thereto to facilitate the accuracy of formation of stereolithographic structures.

In such a manner, a plurality of semiconductor dice, for example memory dice, carried on a carrier substrate in the form of a multi-chip module (for example, a SIMM, a DIMM, a TRIMM or a RIMM) may be encapsulated about five sides thereof if the backsides of the dice are adhered to the carrier substrate. The stereolithographically formed package structure may be configured to cover, for example, wire bonds extending from bond pads on the top, active surface of each die to traces or leads of the carrier substrate. If the multi-chip module, on the other hand, comprises a flip-chip type module, then curable liquid introduced and trapped between the face-down active surface of each semiconductor die and the upper surface of the carrier substrate may be cured and acceleration of the cure of the other portions of the package may be accelerated by a post-fabrication heat cure.

It is also contemplated that electronic component assemblies in the form of carrier substrates comprising lead frame strips and carrying a plurality of semiconductor dice thereon may be similarly carried by a double platen assembly.

It is further contemplated that the double platen assembly of the present invention may be configured for exposure of (and thus formation of stereolithographic structures adjacent to) electronic components on opposing sides of a carrier substrate in the form of, for example, a printed circuit board or lead frame strip, and that platen assembly alignment features be provided to both platens for engagement with platen assembly alignment elements of a platform.

As yet another alternative, a stereolithography apparatus may be configured with structure to permit inversion of a double platen assembly without removal from the stereolithography apparatus.

Another embodiment of the present invention encompasses the gross location and orientation of a plurality of individual electronic components by adhering them in position to a UV-radiation sensitive adhesive-coated film such as is employed in singulation of semiconductor dice from a wafer or other large-scale semiconductor substrate. In this embodiment, individual electronic components in the form of, for example, semiconductor dice may be placed and adhered in preselected, mutually laterally spaced locations in desired orientations to the film, which is supported by a frame member having alignment features thereon configured for engagement with alignment elements on a stereolithography platform or the like. The semiconductor dice may then have stereolithographic structures such as packaging envelopes formed on as many as five sides thereof, the sixth downward-facing side being adhered to the adhesive-coated film. Since silicon is opaque to UV radiation, use of a UV wavelength laser beam to cure the curable liquid into at least a semisolid structure will not release the semiconductor dice from the film. Thus, after the stereolithographic structures have been formed, the frame member bearing the film and now substantially encapsulated semiconductor dice thereon may be removed from the curable liquid in the reservoir, the excess liquid drained off and cleaned as desired. The frame may then be placed in an oven to accelerate and complete curing of the packaging envelopes, after which the frame may be inverted, the underside (now top side) of the inverted film exposed to broad source UV wavelength radiation to alter the characteristics of the UV radiation-sensitive adhesive, and the semiconductor dice released into, for example, a tray having cells sized and configured to receive each substantially packaged (five sides thereof) semiconductor die. Alternatively, the semiconductor dice may be released onto another adhesive-coated film. If the now upwardly facing, bare sixth side of each semiconductor die comprises an active surface bearing bond pads or trace ends for rerouting bond pads for external connection to higher level packaging, the bond pads or trace ends may have discrete conductive elements formed or placed thereon to complete a so-called "flip-chip" die as known in the art. It is contemplated that the discrete conductive elements may comprise solder balls or other metal or alloy balls or bumps, conductive epoxy bumps or pillars, or conductor-filled epoxy bumps or pillars, all as known in the art. The locational and orientational fixation provided by the tray cells facilitates the formation or placement of the discrete conductive elements.

As a further variation of the foregoing embodiment, the tray or second adhesive-coated film carrying active surface-up semiconductor dice may be placed in the same or another stereolithography apparatus, the sixth (active surface) sides covered with cured dielectric material but for apertures exposing bond pads or trace ends, and discrete conductive elements formed or placed in the apertures in contact therewith after the tray has been removed from the stereolithography apparatus, any excess curable liquid removed, the now completely encapsulated (but for the apertures) semiconductor dice cleaned to remove excess curable liquid from the apertures and the dielectric covering on the sixth sides further cured as necessary. Discrete conductive elements may then be formed or placed in the apertures in contact with the bond pads or trace ends to form a flip-chip configured semiconductor die. It is further contemplated that the apertures may be made slightly oversized with respect to the bond pad or trace end size, and a solder paste squeegeed into the apertures in contact with the bond pads and trace ends, after which the tray or film still carrying the semiconductor dice may be placed in an oven to reflow the solder into a ball as known in the art, the wettability to solder of the bond pads or trace ends, in combination with the surface tension of the molten solder, drawing the solder into a ball as the volatile fillers in the paste vaporize and are driven off. The oversized apertures provide apportionment of a required amount of solder paste from which a solder ball of desired size may be reflowed. Of course, this aspect of the present invention may be practiced in a variation wherein only the active surfaces of the semiconductor device are covered with dielectric, but for bond pad or trace end locations, and solder balls formed as described. Such an approach is particularly suitable for wafer-scale processing of a large number of semiconductor dice to form arrangements of solder balls thereon.

The present invention also contemplates additional methods as well as systems for electronic component packaging.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
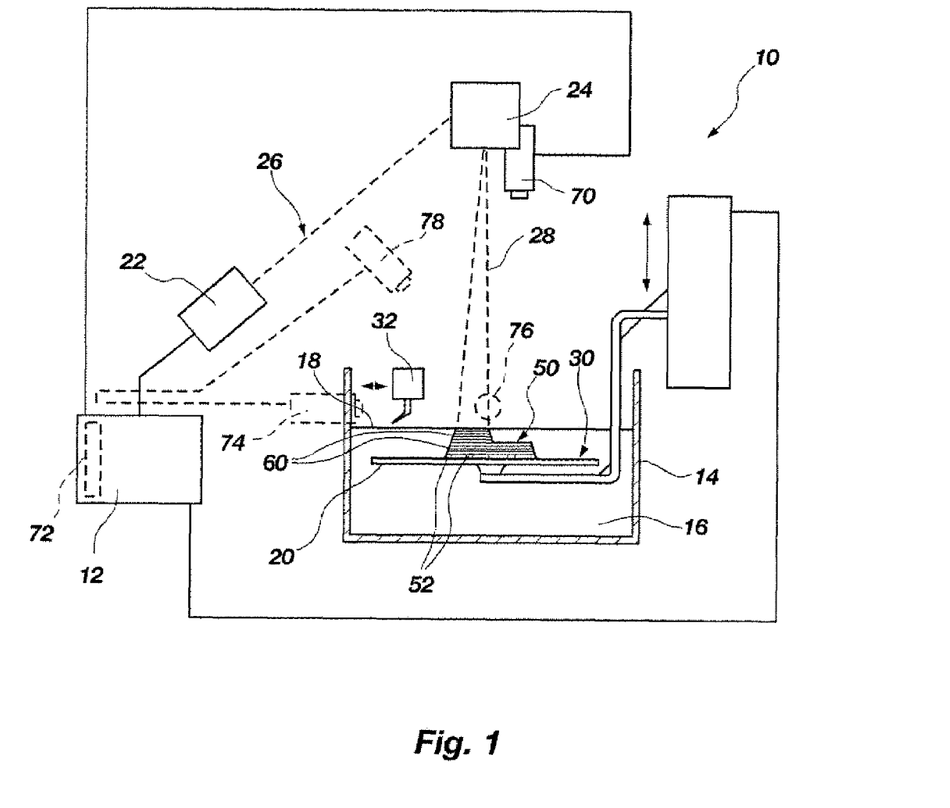
FIG. 1 is a schematic of a stereolithography apparatus suitable for use in the present invention.

FIG. 1 depicts schematically various components, and operation, of an exemplary stereolithography apparatus 10 to facilitate the reader's understanding of the technology employed in implementation of the present invention, although those of ordinary skill in the art will understand and appreciate that apparatus of other designs and manufacture may be employed in practicing the method of the present invention. A currently preferred, basic stereolithography apparatus for implementation of the present invention as well as operation of such apparatus is described in great detail in United States patents assigned to 3D Systems, Inc. of Valencia, Calif., such patents including, without limitation, U.S. Pat. Nos. 4,575,330; 4,929,402; 4,996,010; 4,999,143; 5,015,424; 5,058,988; 5,059,021; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,840,239; 5,854,748; 5,855,718; and 5,855,836. The disclosure of each of the foregoing patents is hereby incorporated herein by this reference. As noted in more detail below, however, a significant modification has been made to conventional stereolithography apparatus, such as those offered by 3D Systems, Inc., in the context of initiation and control of the stereolithographic disposition and fixation of materials. Specifically, the apparatus of FIG. 1 employs a so-called "machine vision" system in combination with suitable programming of the computer controlling the stereolithographic process, as disclosed and claimed in U.S. patent application Ser. No. 09/259,142 filed Feb. 26, 1999, now U.S. Pat. No. 6,549,821, the disclosure of which patent is hereby incorporated herein by reference. Thus, the apparatus as described in FIG. 1 expands the use of stereolithography apparatus and methods to application of materials to large numbers of workpieces. While the workpieces employed may be, by way of example only, semiconductor dice, wafers, partial wafers, other substrates of semiconductor material or carrier substrates bearing integrated circuits on dice or other semiconductor structures, the method and apparatus of the invention are applicable to fabrication of other products.

With reference again to FIG. 1 and as noted above, a 3D CAD drawing of an object to be fabricated in the form of a data file is placed in the memory of a computer 12 controlling the operation of apparatus 10 if computer 12 is not a CAD computer in which the original object design is effected. In other words, an object design may be effected in a first computer in an engineering or research facility and the data files transferred via wide or local area network, tape, disc, CD-ROM or otherwise as known in the art to computer 12 of apparatus 10 for object fabrication.

The data is preferably formatted in an STL (for StereoLithography) file, STL being a standardized format employed by a majority of manufacturers of stereolithography equipment. Fortunately, the format has been adopted for use in many solid-modeling CAD programs, so often translation from another internal geometric database format is unnecessary. In an STL file, the boundary surfaces of an object are defined as a mesh of interconnected triangles.

Apparatus 10 also includes a reservoir 14 (which may comprise a removable reservoir interchangeable with others containing different materials) of liquid material 16 to be employed in fabricating the intended object. In the currently preferred embodiment, the liquid is a photo-curable polymer (hereinafter "photopolymer") responsive to light in the UV wavelength range. The surface level 18 of the liquid material 16 is automatically maintained at an extremely precise, constant magnitude by devices known in the art responsive to output of sensors within apparatus 10 and preferably under control of computer 12. A support platform or elevator 20, precisely vertically movable in fine, repeatable increments responsive to control of computer 12, is located for movement downward into and upward out of liquid material 16 in reservoir 14. A UV wavelength range laser plus associated optics and galvanometers (collectively identified as 22) for controlling the scan of laser beam 26 in the X-Y plane across platform 20 has associated therewith mirror 24 to reflect beam 26 downwardly as beam 28 toward surface 30 of platform 20. Beam 28 is traversed in a selected pattern in the X-Y plane, that is to say, in a plane parallel to surface 30, by initiation of the galvanometers under control of computer 12 to at least partially cure, by impingement thereon, selected portions of liquid material 16 disposed over surface 30 to at least a semisolid state. The use of mirror 24 lengthens the path of the laser beam 26, effectively doubling same, and provides a more vertical beam 28 than would be possible if the laser 22 itself were mounted directly above platform surface 30, thus enhancing resolution.

Data from the STL files resident in computer 12 is manipulated to build an object 50 one layer at a time. Accordingly, the data mathematically representing object 50 is divided into subsets, each subset representing a slice or layer of object 50. This is effected by mathematically sectioning the 3-D CAD model into a plurality of horizontal layers, a "stack" of such layers representing object 50. Each slice or layer may be from about 0.0001 to 0.0300 inch thick. As mentioned previously, a thinner slice promotes higher resolution by enabling better reproduction of fine vertical surface features of object 50. In some instances, a base support or supports 52 for an object 50 may also be programmed as a separate STL file, such supports 52 being fabricated before the overlying object 50 in the same manner, and facilitating fabrication of an object 50 with reference to a perfectly horizontal plane and removal of object 50 from surface 30 of platform 20. Where a "recoater" blade 32 is employed as described below, the interposition of base supports 52 precludes inadvertent contact of blade 32 with surface 30.

Before fabrication of object 50 is initiated with apparatus 10, the primary STL file for object 50 and the file for base support(s) 52 are merged. It should be recognized that, while reference has been made to a single object 50, multiple objects may be concurrently fabricated on surface 30 of platform 20. In such an instance, the STL files for the various objects and supports, if any, are merged. Operational parameters for apparatus 10 are then set, for example, to adjust the size (diameter, if circular) of the laser light beam used to cure liquid material 16.

Before initiation of a first layer for a base support 52 or object 50 is commenced, computer 12 automatically checks and, if necessary, adjusts by means known in the art, the surface level 18 of liquid material 16 in reservoir 14 to maintain same at an appropriate focal length for laser beam 28. U.S. Pat. No. 5,174,931, referenced above and previously incorporated herein by reference, discloses one suitable level control system. Alternatively, the height of mirror 24 may be adjusted responsive to a detected surface level 18 to cause the focal point of laser beam 28 to be located precisely at the surface of liquid material 16 at surface level 18 if level 18 is permitted to vary, although this approach is somewhat more complex. The platform 20 may then be submerged in liquid material 16 in reservoir 14 to a depth equal to the thickness of one layer or slice of the object 50, and the liquid surface level 18 readjusted as required to accommodate liquid material 16 displaced by submergence of platform 20. Laser 22 is then activated so that laser beam 28 will scan liquid material 16 over surface 30 of platform 20 to at least partially cure (e.g., at least partially polymerize) liquid material 16 at selective locations, defining the boundaries of a first layer 60 (of object 50 or base support 52, as the case may be) and filling in solid portions thereof. Platform 20 is then lowered by a distance equal to the thickness of a layer 60, and the laser beam 28 scanned to define and fill in the second layer 60 while simultaneously bonding the second layer to the first. The process is then repeated, layer by layer, until object 50 is completed.

If a recoater blade 32 is employed, the process sequence is somewhat different. In this instance, the surface 30 of platform 20 is lowered into liquid material 16 below surface level 18, then raised thereabove until it is precisely one layer's thickness below blade 32. Blade 32 then sweeps horizontally over surface 30, or (to save time) at least over a portion thereof on which object 50 is to be fabricated, to remove excess liquid material 16 and leave a film thereof of the precise, desired thickness on surface 30. Platform 20 is then lowered so that the surface of the film and material level 18 are coplanar and the surface of the liquid material 16 is still. Laser 22 is then initiated to scan with laser beam 28 and define the first layer 60. The process is repeated, layer by layer, to define each succeeding layer 60 and simultaneously bond same to the next lower layer 60 until object 50 is completed. A more detailed discussion of this sequence and apparatus for performing same is disclosed in U.S. Pat. No. 5,174,931, previously incorporated herein by reference.

As an alternative to the above approach to preparing a layer of liquid material 16 for scanning with laser beam 28, a layer of liquid material 16 may be formed on surface 30 by lowering platform 20 to flood material over surface 30 or over the highest completed layer 60 of object 50, then raising platform 20 and horizontally traversing a so-called "meniscus" blade across the platform (or just the formed portion of object 50) one layer thickness thereabove, followed by initiation of laser 22 and scanning of beam 28 to define the next higher layer 60.

As yet another alternative to layer preparation of liquid material 16 is to merely lower platform 20 to a depth equal to that of a layer of liquid material 16 to be scanned and then traverse a combination flood bar and meniscus bar assembly horizontally over platform 20 (or merely over object 50) to substantially concurrently flood liquid material 16 over platform 20 and define a precise layer thickness of liquid material 16 for scanning.

All of the foregoing approaches to liquid material flooding and layer definition and apparatus for initiation thereof are known in the art and are not material to practice of the present invention, so no further details relating thereto will be provided herein.

Each layer 60 of object 50 is preferably built by first defining any internal and external object boundaries of that layer with laser beam 28, then hatching solid areas of object 50 with laser beam 28. If a particular part of a particular layer 60 is to form a boundary of a void in the object above or below that layer 60, then the laser beam 28 is scanned in a series of closely spaced, parallel vectors so as to develop a continuous surface, or skin, with improved strength and resolution. The time it takes to form each layer 60 depends upon its geometry, surface tension and viscosity of liquid material 16, and thickness of the layer.

Once object 50 is completed, platform 20 is elevated above surface level 18 of liquid material 16, and the platform 20 with object 50 may be removed from apparatus 10. Excess, uncured liquid material 16 on the surface of object 50 may be manually removed, and object 50 then solvent-cleaned and removed from platform 20, usually by cutting it free of base supports 52. Object 50 may then require postcuring, as liquid material 16 may be only partially polymerized and exhibit only a portion (typically 40% to 60%) of its fully cured strength. Postcuring to completely harden object 50 may be effected in another apparatus projecting UV radiation in a continuous manner over object 50 and/or by thermal completion of the initial, UV-initiated partial cure.

In practicing the present invention, a commercially available stereolithography apparatus operating generally in the manner as that described with respect to apparatus 10 of FIG. 1 is currently preferably employed. For example and not by way of limitation, the SLA-250/50HR, SLA-5000 and SLA-7000 stereolithography systems, each offered by 3D Systems, Inc., of Valencia, Calif. are suitable for practice of the present invention. Photopolymers believed to be suitable for use in practicing the present invention include Cibatool SL 5170 and SL 5210 resins for the SLA-250/50HR system, Cibatool SL 5530 resin for the SLA-5000 system and Cibatool SL 7510 resin for the SLA-7000 system. All of these resins are available from Ciba Specialty Chemicals Inc. By way of example and not limitation, the layer thickness of liquid material 16 to be formed, for purposes of the invention, may be on the order of 0.001 to 0.020 inch, with a high degree of uniformity over a field on surface 30 of platform 20. It should be noted that different material layers may be of different heights, so as to form a structure of a precise, intended total height or to provide different material thicknesses for different portions of a structure. The size of the laser beam "spot" 76 impinging on the surface of liquid material 16 to cure same may be on the order of 0.002 inch to 0.008 inch. Resolution is preferably ±0.0003 inch in the X-Y plane (parallel to surface 30) over at least a 0.5 inch×0.25 inch field from a center point, permitting a high resolution scan effectively across a 1.0 inch×0.5 inch area. Of course, it is desirable to have substantially this high a resolution across the entirety of surface 30 of platform 20 to be scanned by laser beam 28, which area may be termed the "field of exposure," such area being substantially coextensive with the vision field of a machine vision system employed in the apparatus of the invention as explained in more detail below. The longer and more effectively vertical the path of laser beam 26/28, the greater the achievable resolution.

Referring again to FIG. 1 of the drawings, it should be noted that apparatus 10 of the present invention includes a camera 70 which is in communication with computer 12 and preferably located, as shown, in close proximity to mirror 24 located above surface 30 of platform 20. Camera 70 may be any one of a number of commercially available cameras, such as capacitive-coupled discharge (CCD) cameras available from a number of vendors. Suitable circuitry as required for adapting the output of camera 70 for use by computer 12 may be incorporated in a board 72 installed in computer 12, which is programmed as known in the art to respond to images generated by camera 70 and processed by board 72. Camera 70 and board 72 may together comprise a so-called "machine vision system," and specifically a "pattern recognition system" (PRS), the operation of which will be described briefly below for a better understanding of the present invention. It should also be noted that the thickness of liquid material 16 forming a layer 60 over a selected portion of a given object 50 may be altered object by object, again responsive to output of camera 70 or one or more additional cameras 74 or 78, shown in broken lines, detecting a protrusion or height of elements or features which should be, but are not, covered by the "design" or preprogrammed thickness of liquid material 16 disposed over and at least partially cured on a prior layer 60. Such capability is particularly useful when creating objects 50 in the form of stereolithographic structures adjacent or over preformed components on or over platform 20, such as is involved in practice of the present invention. Alternatively, a self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Figure 2:
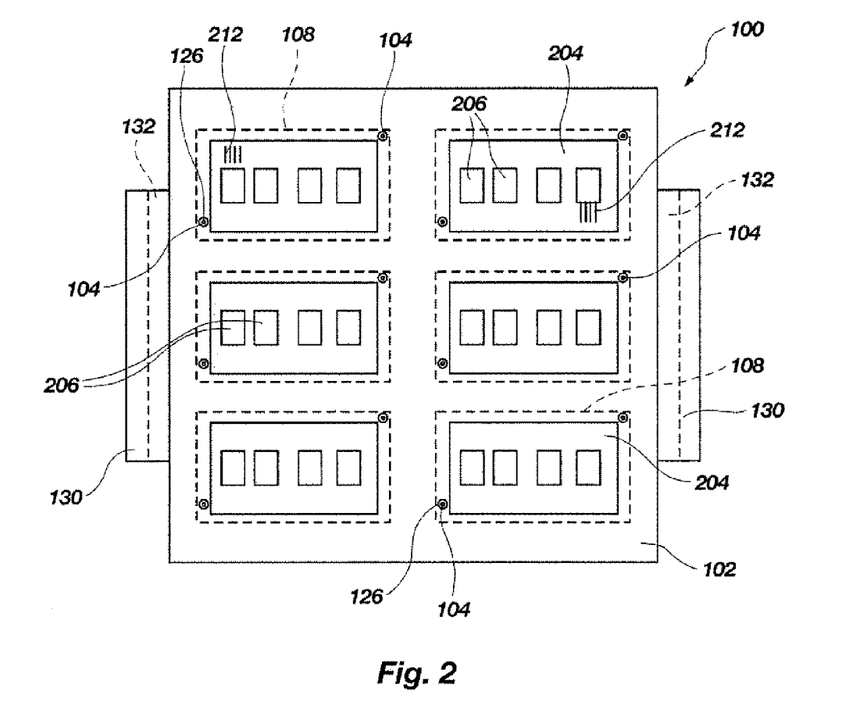
FIG. 2 is a top elevation of one embodiment of a platen assembly of the present invention.
Figure 3:
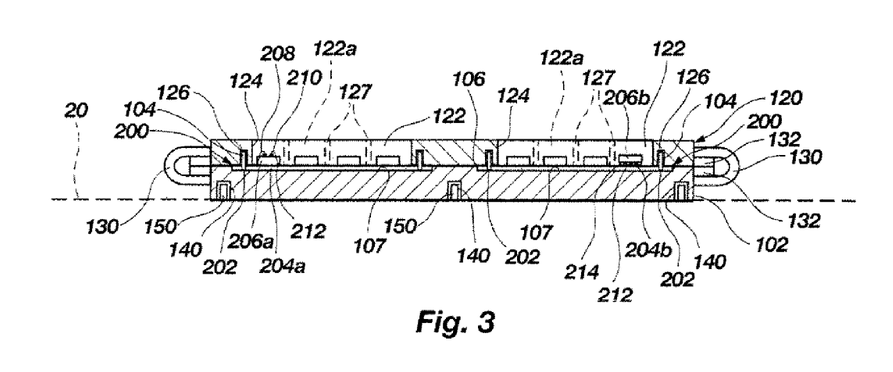
FIG. 3 is a side elevation of the embodiment of FIG. 2.

Referring to FIGS. 2 and 3 of the drawings, one embodiment of a double platen assembly 100 according to the present invention is illustrated. Lower platen 102 includes a plurality of alignment elements in the form of pins 104 extending vertically upward from carrier substrate support surface 106, at least two pins 104 being associated with each electronic component assembly site 108, six such sites 108 being depicted in broken lines in FIG. 2 by way of example only. Carrier substrate support surface 106 may include shallow recesses 107 therein as shown in FIG. 3 to further facilitate alignment and lateral securement of electronic component assemblies in the form of multi-chip modules 200 therein. Also as shown in FIG. 2, pins 104 for each electronic component assembly site 108 are preferably asymmetrically located with respect to the site to ensure proper rotational orientation of each workpiece. Placement of pins 104 is effected to match that of at least two alignment features in the form of apertures 202 in each carrier substrate 204 in the form of a printed circuit board of multi-chip modules 200 to be secured in double platen assembly 100. Multi-chip modules 200 are shown located on lower platen 102 with pins 104 received within apertures 202. Thus, electronic components in the form of semiconductor dice 206 and carried on carrier substrates 204 are located and oriented in accordance with a preselected plan.

Upper platen 120 is shown in partial section in FIG. 3 above lower platen 102 bearing multi-chip modules 200 to better depict component assembly cavities 122 in upper platen 120, the side walls 124 of which frame the locations of semiconductor dice 206 on carrier substrates 204, for example, printed circuit boards. Platen alignment element receptacles in the form of pin receptacles 126 in upper platen 120 are shown in alignment with pins 104 of lower platen 102, with exaggerated clearances therebetween for clarity of illustration, so when upper platen 120 is lowered onto lower platen 102, pins 104 will also align upper platen 120, and consequently component assembly cavities 122, over semiconductor dice 206. As shown in broken lines in FIG. 3, component assembly cavities 122 may be subdivided by compression struts 127 into subcavities 122a, each of which is sized and located to receive a single semiconductor die 206. When upper platen 120 is lowered completely over lower platen 102 in alignment therewith and with multi-chip modules 200 trapped therebetween, upper platen 120 and lower platen 102 may be secured together to clamp carrier substrates 204 in a completely planar configuration, substantially eliminating any potential for board warping or twisting. The use of compression struts 127 further ensures the planarity of carrier substrates 204 by providing multiple points of contact and loading by upper platen 120 oriented Normal to the plane of carrier substrates 204 to preclude bowing of carrier substrates 204. Upper platen 120 may be releasably secured to lower platen 102 by any suitable structure including, for example, clamps 130 engaging aligned flanges 132 on opposing edges of upper and lower platens 120, 102 as illustrated, spring clips, bolts or other means known in the art.

It will be appreciated by those of ordinary skill in the art that component assembly cavities 122 and subcavities 122a are sized and configured with enough lateral clearance between semiconductor dice 206 and side walls 124, including the side walls of compression struts 127, for formation of stereolithographic structures adjacent semiconductor dice 206 without the potential for curing liquid solidifying in adherence to the side walls 124. Of course, if the semiconductor dice 206 are wire bonded to traces on the carrier substrate 204 as shown with respect to left-most semiconductor die 206a in FIG. 3, the lateral clearance will be sufficient to avoid the laterally outer ends of the bond wires 208 bonded between bond pads 210 on semiconductor die 206a and the ends of circuit traces 212 on printed circuit board 204a so as to prevent damage to the bond wires 208 and permit the bond wires 208 to be stereolithographically enveloped by curing of the curable liquid. On the other hand, if a semiconductor die 206 of multi-chip module 200 is a flip-chip die such as right-most semiconductor die 206b in FIG. 3, lateral clearance may be reduced, as discrete conductive elements 214 provide mechanical and electrical connections between semiconductor die 206b and circuit traces 212 on printed circuit board 204b. As noted previously, curable liquid trapped between semiconductor die 206b and printed circuit board 204b may be cured by postcuring in, for example, an oven due to heat-initiated cross linking of the trapped curable liquid, providing an underfill between semiconductor die 206b and printed circuit board 204b, the heat also accelerating the complete cure of other portions of the stereolithographically applied dielectric material. A suitable temperature for postcuring is about 120° C.

As further depicted in FIG. 3, lower platen 102 is desirably provided with platen assembly alignment features such as, for example, apertures 140 for engagement with platen assembly alignment elements 150 projecting from platform 20 as previously identified with respect to FIG. 1 (clearances between platen assembly alignment elements 150 and interiors of apertures 140 being exaggerated for clarity), these cooperative structures ensuring a desired placement of double platen assembly 100 on platform 20 and thus of multi-chip modules 200 secured to double platen assembly 100. The double platen assembly 100 carrying multi-chip modules 200 is incrementally submerged in the curable liquid material 16 within a reservoir 14 and a stereolithographic package structure comprising a plurality of layers of at least partially cured liquid material 16 fabricated as previously described. In the case of active surface-up semiconductor dice 206, it is contemplated that four (4) sides of each die would be encapsulated and the active surface covered except for bond pad locations, unless bond wires 208 extending to circuit traces 212 on carrier substrate 204 have already been formed, in which instance bond wires 208 and the underlying bond pads 210 would also be covered. In the case of active surface-down semiconductor dice 206, it is contemplated that five (5) sides of each die would be encapsulated, the sixth, downward-facing active surface remaining free of packaging material.

After all semiconductor dice 206 of multi-chip modules 200 have had stereolithographic structures formed thereon, double platen assembly 100 is raised above the level of liquid material 16 and lower platen 102 disengaged from alignment elements 150 of platform 20. Excess liquid material 16 may be drained from double platen assembly 100 back into reservoir 14, then double platen assembly 100 with at least partially packaged semiconductor dice 206 may be removed from apparatus 10 with their carrier substrates 204 and cleaned, if desired.

Figure 4:
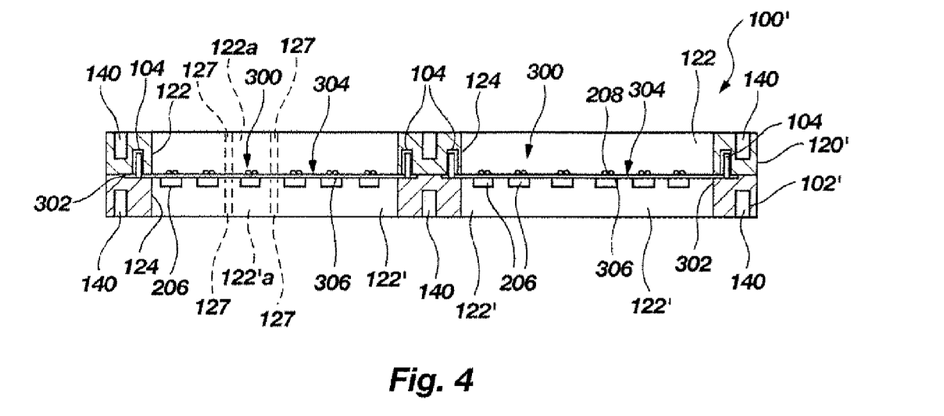
FIG. 4 is a side elevation of another embodiment of a platen assembly of the present invention.

As depicted in FIG. 4, the double platen assembly of the present invention may be fabricated as an embodiment 100' adapted to multi-component assemblies 300 using carrier substrates in the form of lead frame strips 304 having semiconductor dice 206 secured thereto. As shown, semiconductor dice 206 are configured with central rows of bond pads (not shown) wire bonded with bond wires 208 to leads 306 of lead frames of lead frame strips 304 and are adhered by their active surfaces to the undersides of leads 306 of lead frames of lead frame strips 304 in a leads-over-chip, or LOC, configuration as known in the art. Thus, lower platen 102' is provided with component assembly cavities 122' (including, as desired, subcavities 122'a) to receive the semiconductor dice 206 suspended from lead frame strips 304. In this embodiment, pins 104 are sized and located to project through selected apertures 302 in the form of indexing holes conventionally employed in lead frame strips 304. Upper platen 120' includes the same features as previously described with respect to upper platen 120, with component assembly cavities 122 and subcavities 122a (again, as desired) sized and configured with appropriate lateral clearances about semiconductor dice 206. With embodiment 100', the double platen assembly may be placed on and engaged with a platform 20 of a stereolithography apparatus, stereolithographic packaging structures formed as described previously on semiconductor dice 206 including encapsulation of bond wires 208, double platen assembly 100' removed from the stereolithography apparatus, inverted and reengaged with platform 20 by a second set of platen assembly alignment aperatures 140 with platen assembly alignment elements 150 (not shown in FIG. 4), and the backside and lateral sides of semiconductor dice 206 encapsulated with a dielectric, stereolithographically formed structure to complete packaging thereof, cavities 122' and subcavities 122'a providing access to semiconductor dice 206 with double platen assembly 100' in an inverted orientation. It is also contemplated that a suitably configured double platen assembly 100' may be used to encapsulate semiconductor dice 206 on two opposing sides of a multi-chip module 200, modules so configured being well known in the art.

Figure 7:
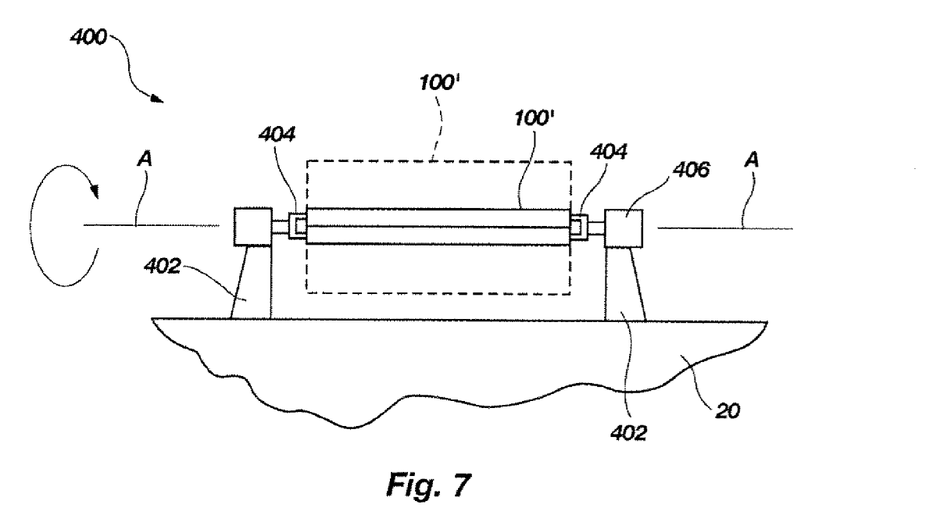
FIG. 7 is a schematic side elevation of a platen assembly support structure usable in the stereolithography apparatus of FIG. 1 in practicing the present invention.

In lieu of removing a double platen assembly 100' from a stereolithography apparatus in order to invert the double platen assembly 100', stereolithography apparatus 10 may be configured with a platen assembly support structure 400 as schematically depicted in FIG. 7 of the drawings. Platen assembly support structure 400 may include opposing towers 402, each having a platen assembly engagement structure 404 for engaging a double platen assembly 100' from opposing sides thereof, the platen assembly engagement structures 404 being rotatable about mutually aligned horizontal axes A. Bearing assemblies (not shown) may be employed to facilitate smooth rotation and a high degree of precision of alignment of horizontal axes A so that double platen assembly 100' and all features thereof as well as the positions of multi-chip modules 200 or multi-component assemblies 300 will not be shifted in position in the X-Y plane and will thereby be easily recognizable and locatable by camera 70 of the machine vision system of apparatus 10. These coincident axes A permit 180° inversion of a double platen assembly 100' to facilitate formation of stereolithographic structures on electronic components on both sides of a carrier substrate such as a carrier substrate 204 or exposed from both sides of a carrier substrate such as a lead frame strip 304. The double platen assembly 100' may be locked in either an upright or inverted position by any suitable device known in the art with the carrier substrate 204, 304 on a level plane. Inversion of double platen assembly 100' may be automated using a rotary stepper motor or other suitable motor 406. Initiation of rotation and termination thereof may be automated and under the control of computer 12 of apparatus 10. Thus, stereolithographic structures may be formed adjacent to semiconductor dice 206 on both sides of a carrier substrate 204 or adjacent all sides of semiconductor dice carried by a lead frame strip 304 without removal of double platen assembly 100' from stereolithography apparatus 10.

While described with respect to carrier substrates in the form of printed circuit boards and lead frame strips, the present invention encompasses the use of electronic component assemblies including any type of carrier substrate, including, without limitation, interposers for flip-chip configuring semiconductor dice. Those of ordinary skill in the art will readily understand and appreciate the manner in which the previously described embodiments may be modified and adapted to use with various other carrier substrates as well as semiconductor die configurations and electrical connection approaches.

In a method of the present invention employing the apparatus of FIGS. 3 and 4, a lower platen 102, 102' of a double platen assembly 100, 100' is loaded with multi-chip modules 200 as described above, the upper platen 120, 120' superimposed thereon and secured thereto, and the loaded double platen assembly 100, 100' placed on a platform 20 of a stereolithography apparatus 10 with the alignment aperatures 140 of the lower platen 102 engaged with alignment elements 150 of platform 20. The double platen assembly 100, 100' is incrementally submerged in the curable liquid material 16 within a reservoir 14 and a stereolithographic package structure comprising a plurality of layers of at least partially cured liquid material 16 fabricated on each semiconductor die 206 as previously described. In the case of active surface-up semiconductor dice 206, it is contemplated that four sides of each die would be encapsulated, and the active surface covered except for bond pad locations. In the case of active surface-down semiconductor dice 206, it is contemplated that all six sides of each semiconductor die 206 would be encapsulated, the sixth, downward-facing active surface being encapsulated about discrete conductive elements 214 due to cross linking of liquid material 16 trapped between the dice 206 and the carrier substrates 204 in association with the cross linking of the surrounding sides of the stereolithographic structure having cross linking directly initiated by exposure to the UV laser beam.

After all semiconductor dice 206 carried by double platen assembly 100 have had stereolithographic structures formed thereon, double platen assembly 100 is raised above the level of liquid material 16 and disengaged from alignment elements 150 of platform 20. Excess liquid material 16 may be drained from double platen assembly 100 back into reservoir 14, then double platen assembly 100 with at least partially packaged semiconductor dice 206 of multi-chip modules 200 is removed from apparatus 10 and cleaned, if desired. Multi-chip modules 200 with packaged semiconductor dice 206 are then removed from double platen assembly 100.

In a method of the present invention employing double platen assembly 100', the acts are the same except that double platen assembly 100' is inverted and reengaged with alignment elements 150 of platform 20 and the remaining, unencapsulated portions of semiconductor dice 206 stereolithographically encapsulated, as desired. The double platen assembly 100' is then raised out of liquid material 16, drained, cleaned and multi-component assemblies 300 in the form of lead frame strips 304 bearing semiconductor dice 206 removed from double platen assembly 100'. As noted previously, this method may also be used with multi-chip modules 200 bearing semiconductor dice 206 on opposing sides thereof.

Figure 5:
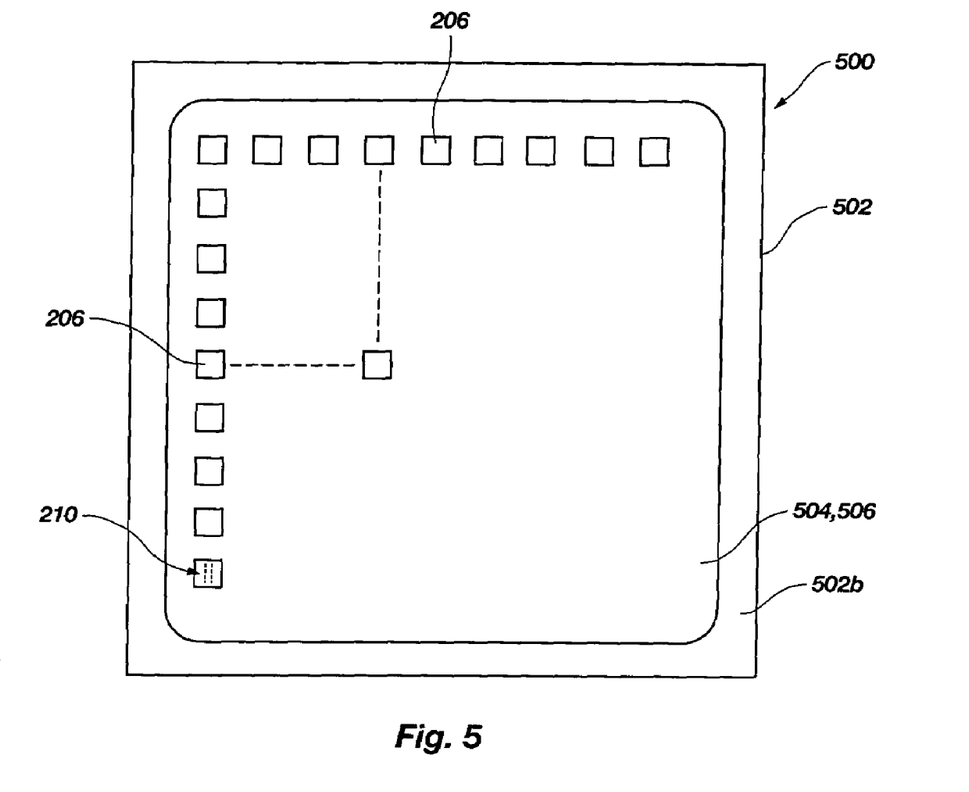
FIG. 5 is a top elevation of a further embodiment of apparatus of the present invention in the form of a frame assembly.
Figure 6:
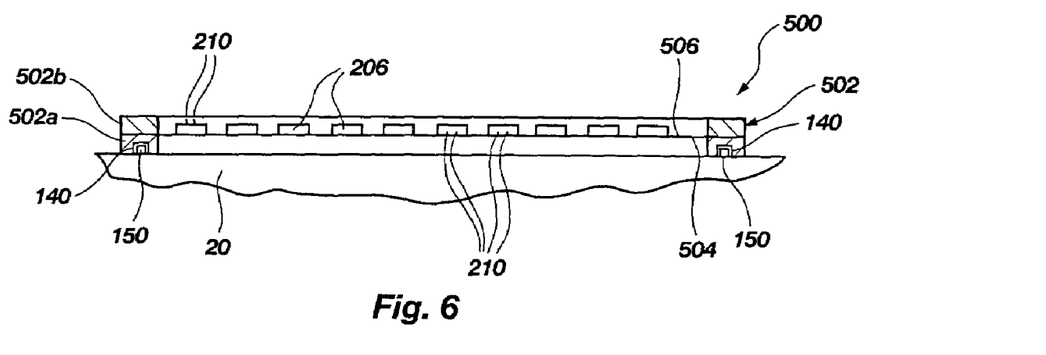
FIG. 6 is a side elevation of the embodiment of FIG. 5.

Referring now to FIGS. 5 and 6 of the drawings, a further embodiment of the present invention comprising frame assembly 500 includes a frame member 502 having suspended therein under tension a film 504 having an ultraviolet (UV) wavelength-sensitive adhesive 506 disposed on an upper surface. As shown, frame member 502 may be a two-part frame comprising parts 502a and 502b, and film 504 is placed under tension by stretching it over one part 502a and then clamping the other part 502b to the one part 502a to maintain the film tension. Suitable UV radiation-sensitive adhesive-coated films are available from 3M and Nitto Denko, the film selected being at least somewhat a function of the temperature to which it may be exposed during processing. For example, 3M offers a film which does not degrade until reaching about 320° C., while Nitto Denko film degrades at a far lower temperature (140° C.), but is far less costly. Frame member 502 includes alignment features such as, for example, apertures 140 for engagement with alignment elements 150 projecting from platform 20 as previously identified with respect to FIG. 3, these cooperative structures ensuring a desired placement of frame member 502 on platform 20 and thus of semiconductor dice 206 adhered to film 504.

In practice, a pick-and-place machine as known in the art may be employed to remove electronic components such as semiconductor dice 206 from, for example, a so-called JEDEC tray having a plurality of cells therein arranged in rows and columns (only some semiconductor dice 206 shown by way of example in FIG. 5), each cell containing a single semiconductor die 206, and place each removed semiconductor die on film 504 at a preprogrammed location within a resolution of about ± one to two mils, or one to two thousandths of an inch, such pick-and-place equipment being commercially available. Thus, a plurality of semiconductor dice 206 may be placed in an array of, for example, rows and columns and mutually laterally spaced with a lateral clearance (also termed "spacing or pitch") between individual semiconductor dice 206 sufficient to form stereolithographic structures thereabout. The semiconductor dice 206 may be placed active surface up and configured with bond pads or rerouted bond pads 210 positioned for wire bonding, or may be placed active surface down in the case of semiconductor dice to be configured as flip-chips, with discrete conductive elements such as solder balls to be placed or formed on an array of bond pads or rerouted bond pads 210. Both configurations of semiconductor dice 206 are depicted in FIGS. 5 and 6 for clarity.

In a method of the present invention employing the apparatus of FIGS. 5 and 6, a frame assembly 500 having semiconductor dice 206 disposed on film 504 and adhered to adhesive 506 is secured by alignment features, for example, alignment aperatures 140 to the alignment elements 150 of a platform 20 of a stereolithography apparatus 10. The frame assembly 500 is incrementally submerged in the curable liquid material 16 within a reservoir 14 and a stereolithographic package structure comprising a plurality of layers of at least partially cured liquid material 16 fabricated on each semiconductor die 206 as previously described. In the case of active surface-up semiconductor dice 206, it is contemplated that four sides of each die would be encapsulated, and the active surface covered except for bond pad locations. In the case of active surface-down semiconductor dice 206, it is contemplated that five (5) sides of each die would be encapsulated, the sixth, downward-facing active surface remaining free of packaging material.

After all semiconductor dice 206 on film 504 have had stereolithographic structures formed thereon, frame assembly 500 is raised above the level of liquid material 16 and frame member 502 disengaged from alignment elements 150 of platform 20. Excess liquid material 16 may be drained from frame assembly 500 back into reservoir 14, then frame assembly 500 with at least partially packaged semiconductor dice 206 adhered thereto removed from apparatus 10 and cleaned, if desired. Frame assembly 500 may then be placed in an oven to accelerate and complete the cure of the stereolithographic packaging structures, or subjected to broad source UV radiation for the same purpose. Subsequently, frame assembly 500 is inverted over, for example, a tray such as another JEDEC tray or other suitable receptacle and subjected to broad source UV radiation from above to cause adhesive 506 to release semiconductor dice 206 from film 504. It should be noted again that the UV laser beam and optional broad source UV radiation do not degrade adhesive 506 when frame assembly 500 is right-side up, as silicon is opaque to UV radiation and so the adhesive 506 underlying each semiconductor die 206 is not exposed. Instead of releasing semiconductor dice 206 into a JEDEC tray or other receptacle, it is contemplated that semiconductor dice 206 may be released onto another frame assembly 500 and adhered to a film 504 thereof by a UV radiation-sensitive adhesive 506 for further processing in stereolithography apparatus 10 or elsewhere.

After semiconductor dice 206 are released from film 504, they may then be processed further. For example, in the case of the semiconductor dice 206 encapsulated on four sides and over the active surface, but for the bond pad locations, these may then be picked up by another pick-and-place machine and secured to die sites on a carrier substrate to form a multi-chip module and then wire bonded or otherwise electrically connected, as by TAB elements comprising circuit traces on a flexible dielectric film, to circuit traces on the carrier substrate. In the case of the semiconductor dice 206 encapsulated on five sides, the semiconductor dice 206 may be released into a receptacle having a plurality of rectangular cells therein to maintain alignment of the semiconductor dice 206 in an array and reinserted into an apparatus 10 where the now upward-facing sixth side (active surface) may be encapsulated, but for the bond pad locations. Alternatively, as noted above, the semiconductor dice 206 may be released onto film 504 of another frame assembly 500. After this operation is complete, the packages are completely cured and the semiconductor dice 206 are cleaned, and discrete conductive elements such as solder balls, conductive epoxy bumps or pillars or conductor-filled epoxy bumps or pillars are placed or formed on the bond pads 210 to complete the fabrication of flip-chip semiconductor dice 206. It should also be noted that, instead of bare semiconductor dice 206, semiconductor dice 206 secured and electrically connected to conductively bumped interposers may be placed with bumps down and adhered to film 504, and the exposed sides and backside of each semiconductor die 206 encapsulated to complete packaging thereof. Further, either before or after five-sided stereolithographic packaging structures are formed, a Z-axis anisotropically conductive film as known in the art may be adhered to the active surfaces and thus over the bond pads 210 of semiconductor dice 206 in lieu of discrete conductive elements to provide external electrical connections for each semiconductor die 206.

Figure 8:
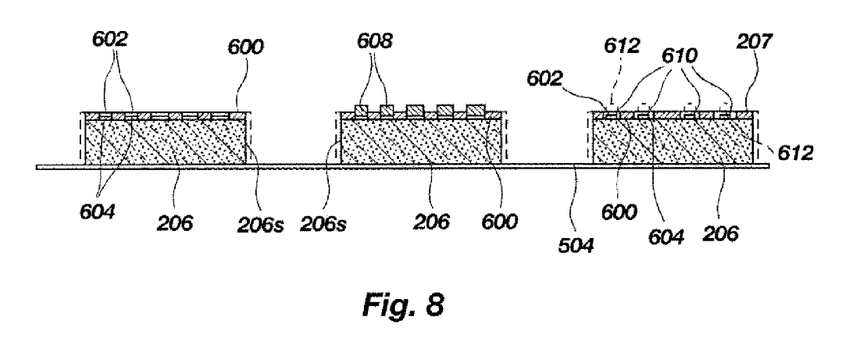
FIG. 8 is a partial sectional side elevation of a plurality of semiconductor dice in process according to a further embodiment of the present invention.

As a further variation of the invention, and with reference to FIG. 8 of the drawings, a tray or film (film 504 shown) carrying active surface-up semiconductor dice 206 may be placed in a stereolithography apparatus 10, the active surface sides 207 thereof covered with cured dielectric material 600 but for apertures 602 exposing bond pads or trace ends 604. Discrete conductive elements 608 as shown with respect to center semiconductor die 206 may then be formed or placed in the apertures 602 in contact with bond pads or trace ends 604 after the tray or film has been removed from the stereolithography apparatus 10, any excess curable liquid removed, the semiconductor dice 206 cleaned to remove excess curable liquid from the apertures 602 and the dielectric material 600 covering the active surface sides 207 further cured as necessary or desired. Discrete conductive elements 608 may comprise, for example, solder or other metal or alloy balls or bumps, or a conductive or conductor-filled epoxy, as known in the art. The discrete conductive elements 608 may be preformed or formed in place on semiconductor dice 206. Of course, the side walls 206s of semiconductor dice 206 may also be encapsulated concurrently with the active surface sides 207 as described previously and as shown in broken lines in FIG. 8.

It is further contemplated as depicted at the right-hand side of FIG. 8 that the apertures 602 may be made slightly oversized with respect to the bond pad or trace end 604, and a solder paste 610 squeegeed into the apertures 602 in contact with the bond pads or trace ends 604, after which the tray or film still carrying the semiconductor dice 206 may be placed in an oven to reflow the solder into a ball or bump 612 (shown in broken lines) as known in the art, the wettability to solder of the bond pads or trace ends 604 in combination with the surface tension of the molten solder drawing the solder into a ball 612 as the volatile fillers in the paste vaporize and are driven off. The oversized apertures 602 provide apportionment of a required amount of solder paste 610 from which a solder ball 612 of desired size may be reflowed. Of course, this aspect of the present invention may be practiced in a variation wherein only the active surfaces of the semiconductor dice are covered with dielectric material (rather than five or six sides as described above), but for bond pad or trace end locations, and solder balls formed as described. Such an approach is particularly suitable for wafer-scale processing of a large number of semiconductor dice to form arrangements of solder balls thereon.

It will be recognized and appreciated by those of ordinary skill in the art that the cooperative structures employed to align and secure a double platen assembly 100 or 100' or a frame assembly 500 within a stereolithography apparatus 10 may comprise any suitable structures known in the art and that, for example, a double platen assembly 100 or 100' or a frame assembly 500 may include projections engageable with apertures in a platform 20. Other structures for alignment of double platen assembly 100 or 100' or a frame assembly 500 include frames or stops disposed on a platform, and double platen assembly 100 or 100' or a frame assembly 500 may be clamped to a platform 20.

Having thus described certain preferred embodiments of the present invention, it is to be understood that the invention defined by the appended claims is not to be limited by particular details set forth in the above description, as many apparent variations thereof are possible without departing from the spirit or scope thereof as hereinafter claimed.

What is claimed is:

1. An apparatus for fabrication of articles, comprising:
   a stereolithography system structured for formation of material in at least a semisolid state in at least one layer to form a structure abutting a pre-existing workpiece located within a vision field above a platform of the stereolithography system, the platform having platen assembly alignment elements projecting therefrom;
   a machine vision system in operable communication with the stereolithography system including at least one camera oriented for detecting objects within the vision field;
   a computer in operable communication with both the stereolithography system and the machine vision system, the computer being programmed to respond to input from the machine vision system indicative of the presence, location and orientation of at least one workpiece in the vision field and to initiate and control the stereolithography system to form at least one structure of at least one layer of an at least semisolid material abutting the at least one workpiece;
   a first platen including a plurality of sets of alignment elements projecting therefrom, the sets of alignment elements configured and positioned for cooperatively engaging sets of alignment features of a like plurality of electronic component assemblies arranged in a plurality of mutually laterally spaced locations over the first platen, the first platen further including platen assembly alignment features engaged with the platen assembly alignment elements; and
   a second platen including a plurality of component cavities extending therethrough at a plurality of mutually laterally spaced locations corresponding to the locations over the first platen, the second platen further including a plurality of sets of alignment element receptacles configured and positioned to respectively receive therein the plurality of sets of alignment elements with the second platen superimposed on the first platen.

2. The apparatus of claim 1, wherein the alignment elements comprise pins.

3. The apparatus of claim 1, wherein each set of alignment elements comprises at least two alignment elements located adjacent each component cavity of the plurality.

4. The apparatus of claim 1, wherein each component cavity of the plurality is divided into a plurality of subcavities separated by strut members.

5. The apparatus of claim 4, wherein the first platen further includes another plurality of component cavities therethrough at a plurality of mutually laterally spaced locations corresponding to the plurality of mutually laterally spaced locations over the first platen.

6. The apparatus of claim 5, wherein each component cavity of the another plurality is divided into a plurality of subcavities separated by strut members.

7. The apparatus of claim 1, wherein the first platen further includes another plurality of component cavities therethrough at a plurality of mutually laterally spaced locations corresponding to the plurality of mutually laterally spaced locations over the first platen.

8. The apparatus of claim 7, wherein each component cavity of the another plurality is divided into a plurality of subcavities separated by strut members.

9. The apparatus of claim 1, wherein the plurality of component cavities are each sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen.

10. The apparatus of claim 9, wherein each component cavity of the plurality is divided into a plurality of subcavities separated by strut members, and wherein each of the plurality of subcavities is sized and configured to provide lateral clearance about one or more electronic components projecting from a carrier substrate of the electronic component assembly having a set of alignment features engaged with a set of alignment elements projecting from the first platen and received in a set of alignment element receptacles of the second platen.

11. The apparatus of claim 10, wherein the first platen further includes another plurality of component cavities therethrough at a plurality of mutually laterally spaced locations corresponding to the plurality of mutually laterally spaced locations over the first platen, each component cavity of the another plurality sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen.

12. The apparatus of claim 11, wherein each component cavity of the another plurality is divided into a plurality of subcavities separated by strut members, and wherein each of the plurality of subcavities is sized and configured to provide lateral clearance about one or more electronic components projecting from a carrier substrate of an electronic component assembly having a set of alignment features engaged with a set of alignment elements projecting from the first platen and received in a set of alignment element receptacles of the second platen.

13. The apparatus of claim 1, wherein the first platen further includes another plurality of component cavities therethrough at a plurality of mutually laterally spaced locations corresponding to the plurality of mutually laterally spaced locations over the first platen, each component cavity of the another plurality sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen.

14. The apparatus of claim 13, wherein each component cavity of the another plurality is divided into a plurality of subcavities separated by strut members, and wherein each of the plurality of subcavities is sized and configured to provide lateral clearance about one or more electronic components projecting from a carrier substrate of the electronic component assembly having a set of alignment features engaged with a set of alignment elements projecting from the first platen and received in a set of alignment element receptacles of the second platen.

15. The apparatus of claim 1, further comprising structure releasably securable to at least one of the first platen and the second platen and configured for selective securement of the second platen in superimposition to the first platen.

16. An apparatus for fabrication of articles, comprising:
a stereolithography system structured for formation of material in at least a semisolid state in at least one layer to form a structure abutting a pre-existing workpiece located within a vision field of the stereolithography system, the stereolithography system further including a platen assembly support structure configured for engagement with a platen assembly and enabling inversion of a platen assembly engaged therewith by rotation of the platen assembly about a horizontal axis;
a machine vision system in operable communication with the stereolithography system including at least one camera oriented for detecting objects within the vision field; and
a computer in operable communication with both the stereolithography system and the machine vision system, the computer being programmed to respond to input from the machine vision system indicative of the presence, location and orientation of at least one workpiece in the vision field and to initiate and control the stereolithography system to form at least one structure of at least one layer of an at least semisolid material abutting the at least one workpiece.

17. The apparatus of claim 16, further including a platen assembly engaged with the platen assembly support structure, the platen assembly comprising:
a first platen including a plurality of sets of alignment elements projecting therefrom, the sets of alignment elements configured and positioned for cooperatively engaging sets of alignment features of a like plurality of electronic component assemblies arranged in a plurality of mutually laterally spaced locations over the first platen; and
a second platen including a plurality of component cavities extending therethrough at a plurality of mutually laterally spaced locations corresponding to the locations over the first platen, the second platen further including a plurality of sets of alignment element receptacles configured and positioned to respectively receive therein the plurality of sets of alignment elements with the second platen superimposed on the first platen.

18. The apparatus of claim 17, wherein the alignment elements comprise pins.

19. The apparatus of claim 17, wherein each set of alignment elements comprises at least two alignment elements located adjacent each component cavity of the plurality.

20. The apparatus of claim 17, wherein each component cavity of the plurality is divided into a plurality of subcavities separated by strut members.

21. The apparatus of claim 20, wherein the first platen further includes another plurality of component cavities therethrough at a plurality of mutually laterally spaced locations corresponding to the plurality of mutually laterally spaced locations over the first platen.

22. The apparatus of claim 21, wherein each component cavity of the another plurality is divided into a plurality of subcavities separated by strut members.

23. The apparatus of claim 17, wherein the first platen further includes another plurality of component cavities therethrough at a plurality of mutually laterally spaced locations corresponding to the plurality of mutually laterally spaced locations over the first platen.

24. The apparatus of claim 23, wherein each component cavity of the another plurality is divided into a plurality of subcavities separated by strut members.

25. The apparatus of claim 17, wherein each of the plurality of component cavities is sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen.

26. The apparatus of claim 25, wherein each component cavity of the plurality is divided into a plurality of subcavities separated by strut members, and wherein each of the plurality of subcavities is sized and configured to provide lateral clearance about one or more electronic components projecting from a carrier substrate of the electronic component assembly having a set of alignment features engaged with a set of alignment elements projecting from the first platen and received in a set of alignment element receptacles of the second platen.

27. The apparatus of claim 26, wherein the first platen further includes another plurality of component cavities therethrough at a plurality of mutually laterally spaced locations corresponding to the plurality of mutually laterally spaced locations over the first platen, each component cavity of the another plurality sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen.

28. The apparatus of claim 27, wherein each component cavity of the another plurality is divided into a plurality of subcavities separated by strut members, and wherein each of the plurality of subcavities is sized and configured to provide lateral clearance about one or more electronic components projecting from a carrier substrate of the electronic component assembly having a set of alignment features engaged with a set of alignment elements projecting from the first platen and received in a set of alignment element receptacles of the second platen.

29. The apparatus of claim 17, wherein the first platen further includes another plurality of component cavities therethrough at a plurality of mutually laterally spaced locations corresponding to the plurality of mutually laterally spaced locations over the first platen, each component cavity of the another plurality sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen.

30. The apparatus of claim 29, wherein each component cavity of the another plurality is divided into a plurality of subcavities separated by strut members, and wherein each of the plurality of subcavities is sized and configured to provide lateral clearance about one or more electronic components projecting from a carrier substrate of the electronic component assembly having a set of alignment features engaged with a set of alignment elements projecting from the first platen and received in a set of alignment element receptacles of the second platen.

31. The apparatus of claim 17, further comprising structure releasably securable to at least one of the first platen and the second platen and configured for selective securement of the second platen in superimposition to the first platen.

32. An apparatus for facilitating processing of a plurality of electronic component assemblies, comprising:
a first platen including a plurality of sets of alignment elements projecting from a like plurality of shallow recesses in a surface of the first platen, the like plurality of shallow recesses configured to receive a like plurality of electronic component assemblies, and the plurality of sets of alignment elements configured and positioned for cooperatively engaging sets of alignment features of the like plurality of electronic component assemblies arranged in a plurality of mutually laterally spaced locations over the first platen; and
a second platen including a plurality of component cavities extending therethrough at a plurality of mutually laterally spaced locations corresponding to the locations over the first platen, the second platen further including a plurality of sets of alignment element receptacles configured and positioned to respectively receive therein the plurality of sets of alignment elements with the second platen superimposed on the first platen, wherein each component cavity of the plurality is divided into a plurality of subcavities separated by strut members.

33. The apparatus of claim 32, wherein the alignment elements comprise pins.

34. The apparatus of claim 32, wherein each set of alignment elements comprises at least two alignment elements located adjacent each component cavity of the plurality.

35. The apparatus of claim 32, further comprising structure releasably securable to at least one of the first platen and the second platen and configured for selective securement of the second platen in superimposition to the first platen.

36. The apparatus of claim 32, wherein at least one of the first platen and the second platen further includes platen alignment features sized, configured and arranged to cooperatively engage a plurality of platen alignment elements projecting thereinto.

37. The apparatus of claim 32, wherein the first platen further includes another plurality of component cavities therethrough at a plurality of mutually laterally spaced locations corresponding to the plurality of mutually laterally spaced locations over the first platen.

38. The apparatus of claim 37, wherein each component cavity of the another plurality is divided into a plurality of subcavities separated by strut members.

39. An apparatus for facilitating processing of a plurality of electronic component assemblies, comprising:
a first platen including a plurality of sets of alignment elements projecting from a like plurality of shallow recesses in a surface of the first platen, the like plurality of shallow recesses configured to receive a like plurality of electronic component assemblies, and the plurality of sets of alignment elements configured and positioned for cooperatively engaging sets of alignment features of the like plurality of electronic component assemblies arranged in a plurality of mutually laterally spaced locations over the first platen wherein the first platen further includes a plurality of first platen component cavities therethrough at a plurality of mutually laterally spaced locations corresponding to the plurality of mutually laterally spaced locations over the first platen; and
a second platen including a plurality of second platen component cavities extending therethrough at a plurality of mutually laterally spaced locations corresponding to the locations over the first platen, the second platen further including a plurality of sets of alignment element receptacles configured and positioned to respectively receive therein the plurality of sets of alignment elements with the second platen superimposed on the first platen.

40. The apparatus of claim 39, wherein each first platen component cavity is divided into a plurality of subcavities separated by strut members.

41. An apparatus for facilitating processing of a plurality of electronic component assemblies, comprising:
a first platen including a plurality of sets of alignment elements projecting from a like plurality of shallow recesses in a surface of the first platen, the like plurality of shallow recesses configured to receive a like plurality of electronic component assemblies, and the plurality of sets of alignment elements configured and positioned for cooperatively engaging sets of alignment features of the like plurality of electronic component assemblies arranged in a plurality of mutually laterally spaced locations over the first platen; and
a second platen including a plurality of component cavities extending therethrough at a plurality of mutually laterally spaced locations corresponding to the locations over the first platen, the second platen further including a plurality of sets of alignment element receptacles configured and positioned to respectively receive therein the plurality of sets of alignment elements with the second platen superimposed on the first platen, wherein the plurality of component cavities are each sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen, and each component cavity of the plurality is divided into a plurality of subcavities separated by strut members, and wherein the plurality of subcavities are each sized and configured to provide lateral clearance about one or more electronic components projecting from a carrier substrate of an electronic component assembly having a set of alignment features engaged with a set of alignment elements projecting from the first platen and received in a set of alignment element receptacles of the second platen.

42. The apparatus of claim 41, wherein the first platen further includes another plurality of component cavities therethrough at a plurality of mutually laterally spaced locations corresponding to the plurality of mutually laterally spaced locations over the first platen, each component cavity of the another plurality sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen.

43. The apparatus of claim 42, wherein each component cavity of the another plurality is divided into a plurality of subcavities separated by strut members, and wherein the plurality of subcavities are each sized and configured to provide lateral clearance about one or more electronic components projecting from a carrier substrate of an electronic component assembly having a set of alignment features engaged with a set of alignment elements projecting from the first platen and received in a set of alignment element receptacles of the second platen.

44. An apparatus for facilitating processing of a plurality of electronic component assemblies, comprising:

a first platen including a plurality of sets of alignment elements projecting from a like plurality of shallow recesses in a surface of the first platen, the like plurality of shallow recesses configured to receive a like plurality of electronic component assemblies, and the plurality of sets of alignment elements configured and positioned for cooperatively engaging sets of alignment features of the like plurality of electronic component assemblies arranged in a plurality of mutually laterally spaced locations over the first platen, wherein the first platen further includes a first platen plurality of component cavities therethrough at a plurality of mutually laterally spaced locations corresponding to the plurality of mutually laterally spaced locations over the first platen, each first platen component cavity sized and configured to provide lateral clearance about a plurality of electronic components projecting from a carrier substrate of an electronic component assembly having a set of alignment features engaged with a set of alignment elements projecting from the first platen and received in a set of alignment element receptacles of the second platen; and a second platen including a plurality of second platen component cavities extending therethrough at a plurality of mutually laterally spaced locations corresponding to the locations over the first platen, the second platen further including a plurality of sets of alignment element receptacles configured and positioned to respectively receive therein the plurality of sets of alignment elements with the second platen superimposed on the first platen.

45. The apparatus of claim 44, wherein each first platen component cavity is divided into a plurality of subcavities separated by strut members, and wherein the plurality of subcavities are each sized and configured to provide lateral clearance about one or more electronic components projecting from a carrier substrate of the electronic component assembly having a set of alignment features engaged with a set of alignment elements projecting from the first platen and received in a set of alignment element receptacles of the second platen.

* * * * *